United States Patent [19]

Watkinson

[11] Patent Number: 4,618,999

[45] Date of Patent: Oct. 21, 1986

[54] POLAR LOOP TRANSMITTER

[75] Inventor: Stephen W. Watkinson, Cambridge, England

[73] Assignee: U.S. Philips Corporation, New York, N.Y.

[21] Appl. No.: 774,373

[22] Filed: Sep. 9, 1985

Related U.S. Application Data

[63] Continuation of Ser. No. 577,945, Feb. 8, 1984, abandoned.

[30] Foreign Application Priority Data

Feb. 23, 1983 [GB] United Kingdom ................ 8304975

[51] Int. Cl.⁴ .............................................. H04B 1/04
[52] U.S. Cl. .................................... 455/108; 455/126; 332/37 D
[58] Field of Search ...................... 455/21, 24, 47, 108, 455/109, 116, 126; 332/37 D, 38

[56] References Cited

U.S. PATENT DOCUMENTS

| | | | |
|---|---|---|---|
| 3,662,290 | 5/1972 | Elliott | 455/126 |
| 3,900,823 | 8/1975 | Sokal et al. | 455/126 |
| 4,237,555 | 12/1980 | Dishal | 455/126 |
| 4,481,672 | 11/1984 | Watkinson | 455/108 |

FOREIGN PATENT DOCUMENTS 2117589 10/1983 United Kingdom ................ 455/108

OTHER PUBLICATIONS

"The Design of VHF SSB Polar-Loop Transmitters" by Petrovic et al., 4/1982.

Primary Examiner—Jin F. Ng
Attorney, Agent, or Firm—David R. Treacy

[57] ABSTRACT

A polar loop transmitter having particular, but not exclusive, application in VHF single-sideband radio systems.

In order to avoid having to match the amplitude detectors used in known polar loop transmitters, it is proposed as an alternative to provide a subtracting circuit which produces a difference signal from between the low level input signal and the attenuated output signal. The difference signal is amplitude demodulated in a mixer and the demodulated signal is used as a control signal for the amplitude modulator.

First and second limiting amplifiers are used to derive the carrier signals from the input and output signals. The outputs of the limiting amplifiers are applied to a phase sensitive detector formed by another mixer whose output is used as a correction signal for a voltage controlled oscillator coupled to the amplitude modulator. The output of the first limiting amplifier is also used as the local oscillator signal for the amplitude demodulator.

Means are proposed for compensating for the phase shifts introduced by the limiting amplifiers.

9 Claims, 11 Drawing Figures

POLAR LOOP TRANSMITTER

This is a continuation of application Ser. No. 577,945, filed Feb. 8, 1984, now abandoned.

BACKGROUND OF THE INVENTION

The present invention relates to polar loop transmitters which have particular, but not exclusive, application in a VHF single-sideband (SSB) radio system.

For single-sideband transmissions with an audio bandwidth of typically 300 Hz to 3.3 kHz, it has been proposed to use channels spaced at 5 kHz, thus leaving approximately 1.5 kHz as a guard band. Of particular importance in such a narrow channel system is the level of spurious, out-of-channel, transmitter emissions. In a conventional SSB transmitter, the majority of adjacent channel interference is caused by intermodulation products produced by non-linearities in the power amplifier which is provided to reproduce a low level input signal at a high level. Because linear power amplifiers are very difficult to implement at R.F. frequencies, it is preferred not to use them.

The polar loop principle is well known and has been proposed by Petrovic, V. and Gosling, W., "A Radically New Approach to SSB Transmitter Design", I.E.E. Conference on Radio Transmitters and Modulation Techniques, March 1980, No. 1980/40 page 110, as a means of producing very clean signals at high power levels. In a polar loop transmitter, an audio input signal is mixed with a local oscillator signal in a balanced mixer and either the upper or lower sideband is selected using a sideband filter. The selected sideband signal is resolved into polar components (phase and amplitude) by a first limiter and a first amplitude detector.

A voltage controlled oscillator is provided to generate a signal at the transmitter output frequency. This signal is buffered and fed to an amplitude modulator whose output is fed to an R.F. power amplifier and then to a load, for example an antenna, via a low pass filter.

An important feature of a polar loop transmitter is that it compares the high level output with the low level input to see if there are any errors and if there are, the errors can be used to effect corrections in the amplitude modulator. In order to carry out this comparison, the signal from the low pass filter is sampled and mixed down to the pilot frequency of the selected sideband. This mixed down signal is resolved in polar components (phase and amplitude) by a second limiter and a second amplitude detector. The phase signals from the first and second limiters are compared in a phase sensitive detector and the amplified and filtered output of the phase sensitive detector is applied to the voltage controlled oscillator to lock its phase to that of the input signal.

The signal envelope or amplitude signals from the first and second amplitude detectors are applied to a differential amplifier which produces a control input voltage which amplitude modulates the R.F. carrier from the voltage controlled oscillator. The setting of the D.C. component of the control input voltage is critical because, unless it is correct, the low power signal will not be copied accurately at high power. This is of special significance when the R.F. envelope is to be reduced by, for example, −70 dB with respect to peak envelope power at zero crossings of the input waveform.

A drawback to this known circuit is that, unless the amplitude detectors are matched, non-linearities in the signal paths to the inputs of the differential amplifiers will cause distortions which can lead to spurious, out-of-channel transmitter emissions. One way of obtaining a match between the amplitude detector is to integrate them on a single chip. This has been done experimentally.

SUMMARY OF THE INVENTION

An object of the present invention is to avoid using closely matched amplitude detectors in polar loop transmitters.

According to the present invention there is provided a polar loop transmitter including an amplitude modulator and a power amplifier for producing an output signal, means for producing a difference signal from between an input signal and the output signal, means for amplitude demodulating the difference signal and producing a control signal which is applied to the amplitude modulator.

By obtaining the difference between the input and output signals and using it, after demodulation, as a control input signal to the amplitude modulator, the need for matched amplitude detectors is avoided while, at the same time, a low spurious signal level is maintained. In consequence, the high level output signal is a good copy of the input signal. Additionally, the circuit can readily be implemented using inexpensive available components.

An embodiment of a polar loop transmitter further comprises first and second limiters, the first limiter serves to limit the input signal and the second limiter serves to limit the output signal and phase sensitive detecting means having inputs coupled to outputs of the first and second limiters and an output providing a correction signal for a voltage controlled oscillator. The output of the first limiter is coupled to the amplitude demodulator where it acts as a local oscillator signal and avoids having to provide another reference signal source.

Since the limiters inherently introduce phase shifts, phase shifting means are provided for countering these phase shifts.

If desired, means may be provided for reducing and/or removing transient outputs in the amplitude demodulator output. Additionally, means may be provided for reducing and/or removing spikes resulting from said transient outputs without introducing a phase delay.

BRIEF DESCRIPTION OF THE DRAWINGS

The present invention will now be explained and described, by way of example, with reference to the accompanying drawings, wherein.

DESCRIPTION OF THE PREFERRED EMBODIMENTS

Figure 1:
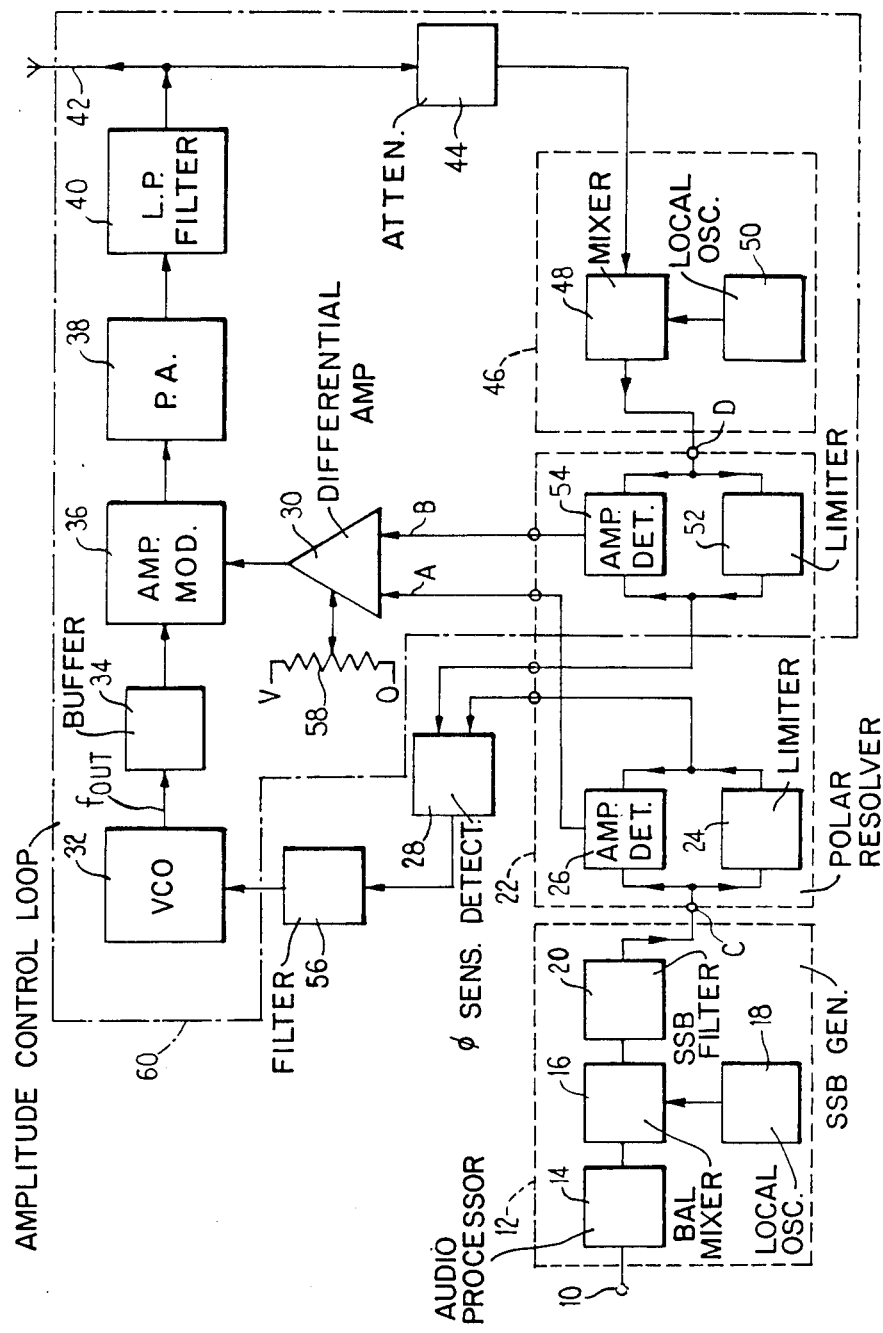
FIG. 1 is a block schematic circuit diagram of a polar loop transmitter disclosed in British Patent Specification No. 2117589A.

In the drawings, the same reference numerals have been used to identify corresponding parts.

The known polar loop transmitter shown in FIG. 1 comprises an input 10 for an audio frequency signal in the frequency range 300 Hz to 3.3 kHz. The signal is passed to a single sideband generator 12 which, in the drawing, comprises an audio processor 14 whose output is connected to one input of a balanced mixer 16 which has a second input for an output from a local oscillator 18. The local oscillator 18 is constructed to produce the purest possible signal output at say 10.7 MHz. The output from the balanced mixer 16 is applied to a sideband filter 20 which selects either the upper or lower sideband and rejects the other(s).

A polar resolver 22 is connected to an output of the sideband filter 20 for resolving the selected sideband signal into polar components. The polar resolver 22 comprises a first limiter 24 which removes the amplitude variations from the signal but preserves the phase information and a first amplitude detector 26 which produces a signal which corresponds to the envelope of the SSB signal, that is, the amplitude information. The phase information is applied to one input of a phase sensitive detector 28 and the amplitude information is applied to one input of a differential amplifier 30 which is implemented as an operational amplifier.

A voltage controlled oscillator (VCO) 32 generates a signal at the transmitter frequency, $f_{out}$, which signal is applied via a buffer 34 to one input of an amplitude modulator 36 whose output is applied to a class B or class C R.F. power amplifier 38. The output from the power amplifier 38 is applied via a low pass filter 40, to an output load in the form of an antenna 42.

In order to reduce any errors of phase and amplitude in the signal being copied, a feedback loop is provided. This loop comprises an attenuator 44 for deriving a portion of the output signal. A frequency converter 46 is connected to the output of the attenuator 44. The converter 46 comprises a mixer 48 which receives a frequency ($f_{out}$—10.7 MHz) from a synthesized local oscillator 50. The output from the mixer 48, which output comprises a frequency translated reproduction of the transmitter output signal, is applied to a second limiter 52 and a second amplitude detector 54 of the polar resolver 22. The phase information from the second limiter 52 is applied as a second input to the phase sensitive detector 28. Any phase differences detected are amplified and filtered in an amplifier and filter 56 and the output therefrom is applied as a correction signal to the voltage controlled oscillator 32. The amplitude information from the second amplitude detector 54 is applied as a second input to the differential amplifier 30. The difference between the two amplitude information signals is applied as a control input voltage to the amplitude modulator 36.

In order for the transmitter to be able to follow the low level input signal when it goes to zero, the amplitude modulator 36 must be capable of reducing the transmitter output level significantly with respect to peak envelope power. By following the modulator 36 with the class B or class C amplifier 38, this performance can be achieved. Such an amplifier 38 has an input threshold level below which the output level is greatly attenuated. In consequence, the amplitude modulator 36 need only reduce the output level to perhaps −20 dB in such a system.

Figure 2:
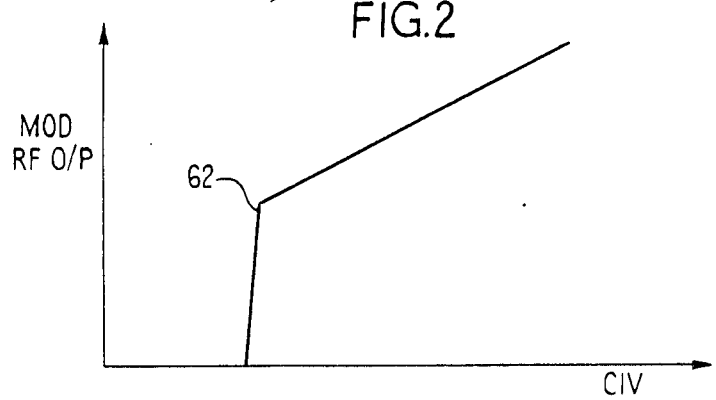
FIG. 2 is a graph of control input voltage (CIV) Plotted against modulator R.F. output voltage (MOD R.F. o/p), FIGS. 3, 4 and 5 graphically show, on the left, waveforms illustrating, respectively, a two-tone input SSB signal and the effects of too low and too high D.C. control input voltages on the SSB signal (FIG. 3) being copied and, on the right, the control input voltages applied to the amplitude modulators to produce these waveforms.

FIG. 2 illustrates a graph of control input voltage (CIV) plotted against modulated R.F. output level for a composite modulator formed by the modulator 36 and the R.F. power amplifier 38. The graph exhibits an abrupt discontinuity or a sharp knee 62 which illustrates that the setting of the D.C. component in the control input voltage is critical with respect to the knee 62. The D.C. component is set using a potentiometer 58 or set automatically using a method as described and claimed in copending British Patent Application No. 8208912 details of which are included by way of reference.

Figure 3:
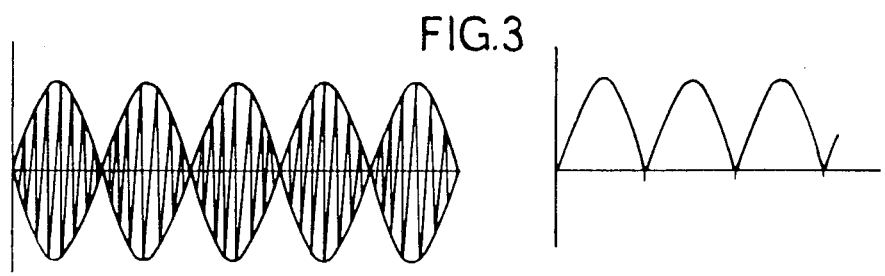
Figure 4:
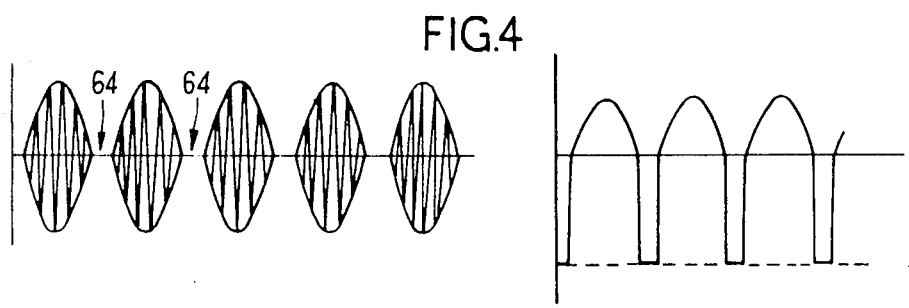
Figure 5:
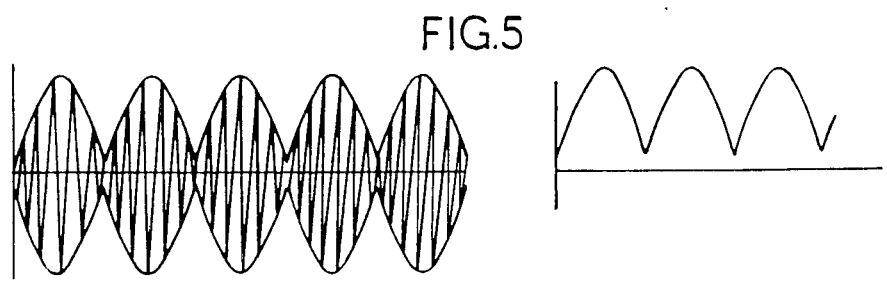

FIG. 3 shows, on the left, a typical two-tone signal SSB waveform which is used to be copied. If the waveform has been copied correctly, then the output waveform would be an amplified version of the input one. However, if the D.C. bias component of the control input voltage to the amplitude modulator 36 is too low, then as shown in the left in FIG. 4 the amplified signal goes to zero too soon so that gaps 64 appear between the envelopes at zero R.F. output level. The left-hand waveform in FIG. 5 shows in contrast the effect of the D.C. bias component of the control input voltage being too high, the right-hand waveform in FIG. 5, with the result that the modulated R.F. output voltage cannot reach zero for a zero level in the input SSB waveform to be copied. Thus, slight errors in this D.C. component of the control input voltage will produce a considerable increase in spurious output signals from the transmitter. It has been proposed to set the D.C. component using a precision manual setting of the potentiometer 58.

In FIG. 1, the amplitude control loop 60 proper is enclosed within the block outlined by dots and dashes. The amplitude control loop 60 has a low voltage gain of the order of one when there is negative feedback but below the abrupt discontinuity or knee 62 (FIG. 2) the amplitude modulator has a gain for example, $\times 10^5$.

The potentiometer 58 is accurately adjusted so that the D.C. component in the differential amplifier 30 output corresponds closely to the knee 62 (FIG. 2) thus enabling the amplitude correction loop 60 to reduce the R.F. output envelope significantly at zero crossings of the input waveform shown on the left in FIG. 3.

If the D.C. bias set by the potentiometer 58 is slightly too low such that negative input peaks take the output below the knee 62, then the negative feedback loop around the differential amplifier 30 will be broken and the output voltage will fall rapidly with the result that negative going spikes will be produced due to the full open loop gain of the differential amplifier 30. As the slope of input to output of the amplitude control loop 60 has a finite but very steep slope below the knee (FIG. 2), the amplitude of the spikes will change significantly with slight adjustment of the potentiometer 58; compare the control input voltage shown in the right-hand waveform in FIG. 4 with that shown on the right-hand side of FIG. 3 in which the negative spikes are just discernable.

A practical difficulty in realizing the known polar loop transmitter circuit shown in FIG. 1 is that an accurate match must exist between the two amplitude detectors 26 and 54. Referring to FIG. 1, when the circuit is working properly with the negative spikes first appearing as shown in the right-hand waveform of FIG. 3, the amplitude of the signals at the inputs A and B to the differential amplifier 30 are forced by the negative feedback of amplitude control loop 60 to be very nearly equal. The higher the loop gain the smaller will be the amplitude error between A and B.

If the signal paths C to A and D to B in FIG. 1 are linear, then any differences in gain between these two paths will be of no consequence; the level D will already have been attenuated from the high level output of the transmitter by the attenuator 44.

However, any non-identical non-linearities in the signal paths to inputs A and B will introduce errors between the signals at C and D which negative feedback action cannot reduce. Even identical non-linearities in the two paths will lead to errors if the levels of the signals passing through those non-linearities are not identical. This would result from different gains (or losses) between the non-linearities and the inputs A and B.

Thus, it follows from the above analysis that the signal paths to the inputs A and B from C and D must be as closely identical as possible. What may appear to be insignificant levels of distortion can lead to very significant levels of transmitter spurious relative to a level of −70 dB.

Figure 6:
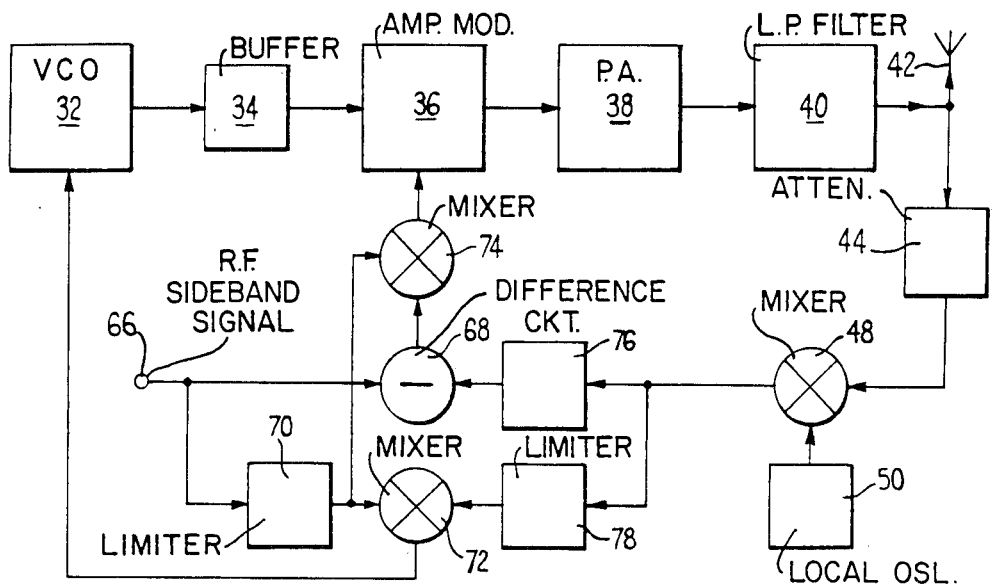
FIG. 6 is a block schematic circuit diagram of a simple embodiment of a polar loop transmitter made in accordance with the invention.

FIG. 6 is a block schematic circuit diagram of a simple embodiment of a polar loop transmitter made in accordance with the present invention.

In FIG. 6, a low level radio frequency sideband signal is applied to an input terminal 66 which is connected to an input of a difference circuit 68 and to a first limiter 70. An output of the first limiter 70 is connected to first and second mixers 72, 74, respectively. As will be explained later the second mixer 74 acts as an amplitude demodulator. The outputs of the mixers 72, 74 are respectively connected to the VCO 32 and to the amplitude modulator 36.

The high level output from the low pass filter 40 is attenuated in attenuator 44, frequency converted in the mixer 48 and applied via a 90° phase shifter 76 to another input of the difference circuit 68 whose output is connected to the second mixer 74 and, via a second limiter 78, to the first mixer 72. The 90° phase shifter 76 is included to remove the 90° phase shift introduced by the phase lock loop of the VCO 32. The simplified circuit assumes no phase shift in the first and second limiters 70, 78 and that the phase lock loop is operating in the center of the phase sensitive detector range where the phase shift is 90°.

In the operation of the circuit shown in FIG. 6, the low level R.F. signal on the input terminal 66 is subtracted from the attenuated and phase corrected output signal in the difference circuit 68. The difference signal is applied to the second mixer 74 where it is multiplied by the limited version of the signal on the input terminal to produce an envelope signal which is applied as a control input voltage to the amplitude modulator 36. Any non-linearities in the amplitude demodulator which is formed by the second mixer 74 are within the feedback loop and will be nullified by feedback action.

A phase difference signal between the input and output signals is derived in the first mixer 72 and is applied to the VCO 32. The first mixer 72 acts as a phase sensitive detector (PSD).

Figure 7:
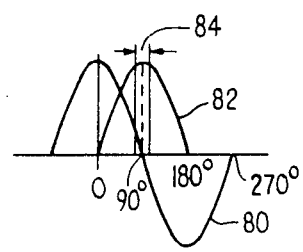
FIG. 7 is a waveform diagram which facilitates the understanding of the phase sensitive detector of FIG. 6.

FIG. 7 illustrates the characteristic curve 80 and 82 of the PSD formed by the first mixer 72 and the amplitude demodulator formed by the second mixer 74, respectively. If the D.C. gain of the phase lock loop is sufficiently high, the change in phase over the lock range, indicated by the reference numeral 84 in FIG. 7, will not be significant and will maintain the amplitude modulator at its maximum gain.

The simplified embodiment of the invention illustrated in FIG. 6 assumes that there is substantially no phase shift in the first and second limiters 70 and 78. In reality, there will be phase shifts and suitable phase shifting circuits have to be included in order to maintain the operating conditions described with reference to FIG. 7.

Figure 8:
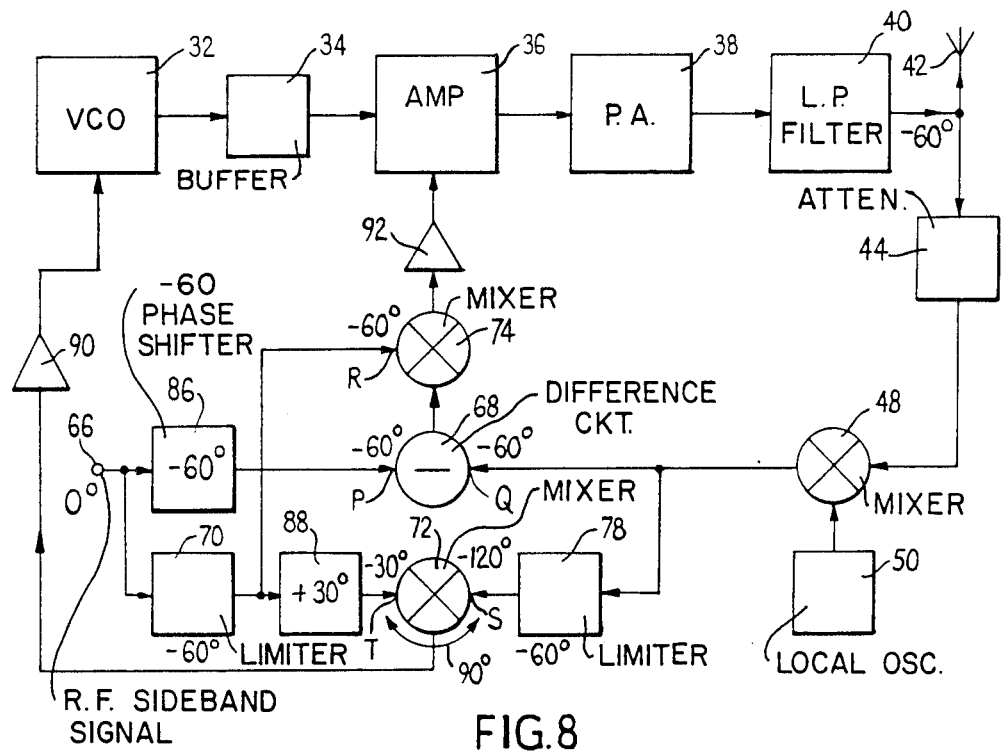
FIG. 8 is a block schematic circuit diagram of a practical embodiment of the polar loop transmitter made in accordance with the present invention.

A block schematic circuit of an embodiment of the present invention which assumes a −60° phase shift in the first and second limiters 70 and 78 is illustrated in FIG. 8. Compared with FIG. 6, the 90° phase shifter 76 has been omitted but a −60° phase shifter 86 has been inserted between the input terminal 66 and the difference circuit 68 and a +30° phase shifter 88 has been inserted between the first limiter 70 and an input to the first mixer 72. The output of the first limiter 70 is connected to the second mixer 74, as before. Loop amplifiers 90 and 92 are respectively connected between the first mixer 72 and the VCO 32 and between the second mixer 74 and the amplitude modulator 36.

Taking the phase of the signal at the input terminal 66 as a reference of zero degrees, then the relative phase shift introduced by the first limiter 70 is −60°. Thus, the limited input signal applied to input R of the second mixer 74, which functions as an amplitude demodulator, has a relative phase of −60°. The feedback loop via the attenuator 44 does not introduce any additional phase shift so that at input Q of the difference circuit 68, the relative phase of the signal is −60°. In order that the signals being subtracted from one another are in phase, the phase shifter 86 introduces a relative phase shift of −60°. With such an arrangement wherein the signals at the inputs P, Q and R are in phase, the amplitude demodulator can have maximum gain and minimum sensitivity to phase.

The second limiter 78 introduces a relative phase shift of −60° so that the signal at an input S of the first mixer 72, which functions as a phase sensitive detector, has a relative phase of −120°. In order to maintain a 90° phase difference between the input S and an input T of the first mixer 72, the relative phase at the input T is made −30° by the +30° phase shifter 88.

In the operation of the circuit, any phase shift introduced by the amplitude modulator 36 and the amplifier 38 is not relevant. Additionally, any change in phase at the output of the amplifier 38 caused by a change in level will be removed by loop action. The circuit otherwise operates in a similar manner to that shown in FIG. 6.

The circuit shown in FIG. 8 can be set-up by the following procedure:

Disconnect input Q of the difference circuit 68.

Connect an amplitude modulated carrier wave source to the input terminal 66 and monitor the output of the amplitude demodulator formed by the second mixer 74.

Adjust the phase shift of the phase shifter 86 for maximum demodulated output. Simultaneously with the adjustment of the phase, the level at the input P of the difference circuit 68 should be maintained constant by varying the input level at the terminal 66. The output of the amplitude demodulator must not be allowed to exceed its maximum peak to peak swing capability and if necessary the gain of the demodulator should be reduced.

Figure 9:
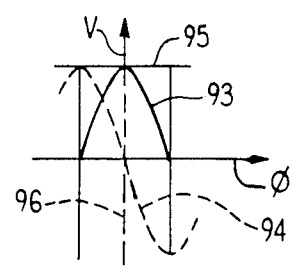
FIG. 9 is a waveform diagram which facilitates the understanding of the setting-up of the amplitude demodulator in FIG. 8, FIG. 10 graphically illustrates transient outputs being produced by the amplitude demodulator when the two-tone test is applied.

The phase shift introduced by the phase shifter 88 is adjusted by reducing the gain of the phase lock loop which is done by reducing the gain of the loop amplifier 90. The output of the phase sensitive detector, i.e. the output of the mixer 72, is monitored and the frequency of the unmodulated carrier applied to the input terminal 66 is varied to swing the phase lock loop error voltage over its full lock range. The phase shifter 88 is adjusted such that the D.C. level at the amplitude demodulator, i.e. the second mixer 74, output is at a maximum when the phase sensitive detector voltage is in the middle of the lock range. When the gain of the phase lock loop is increased to its normal high value, the amplitude demodulator output should remain at the same level over the full lock range as it had in the center of the lock range at the lower loop gain of the phase lock loop. This is illustrated in FIG. 9 wherein the abscissa represents phase $\phi$ and the ordinate voltage V. The curve 93 represents the output of the amplitude demodulator over the lock range for a low gain phase lock loop and the curve 94 represents the phase lock loop error voltage over the lock range for a low gain phase lock loop. The horizontal line 95 represents the constant level output of the amplitude demodulator over the lock range for a high gain phase lock loop and the broken vertical line 96 represents the phase lock loop error voltage over the lock range for a high gain phase lock loop.

In implementing the circuit shown in FIG. 8, the difference circuit 68 can take various forms; the simplest being to feed the signals at P and Q in FIG. 8 to the balanced inputs of a multiplier. One advantage of such an arrangement is that it ensures a minimum of distortion as the balanced mixer inputs are matched by definition. Another advantage is that a good degree of isolation is provided between the inputs P and Q, particularly if their impedances are kept low by adding 50Ω resistors from each input to ground.

The mixer 74 can conveniently be regarded as an amplitude demodulator because its output is the demodulated difference between the signal applied to the inputs P and Q.

In applying the known two equal level tone test, see FIG. 3, problems may occur at the zero crossings of the two-tone signal. At the very instant when the input level falls to zero and the output is also required to be zero, the loop gains of the phase and amplitude control loops are reduced to zero. It is not possible for a feedback loop to operate with zero loop gain and in consequence the loop is effectively broken. With the two-tone test, the resultant input is only zero for a very short time but nevertheless there is a state of uncertainty at and close to these zeros.

The phase of the resultant two tones inverts at each zero crossing. The voltage controlled oscillator 32 must follow this inversion and does so, in practice, by relocking in the new phase. However, the loop will take a finite time to relock, dependent on the loop bandwidth. The loop bandwidth will depend upon the loop gain and the loop gain upon the input level to the phase sensitive detector.

Hence, as the input resultant falls to zero, so does the loop bandwidth. The rate at which this reduction in loop bandwidth takes place can be increased by increasing the slope of the voltage controlled oscillator, the slope of the phase sensitive detector, the loop amplifier gain and by widening the loop filter bandwidth.

Figure 10:
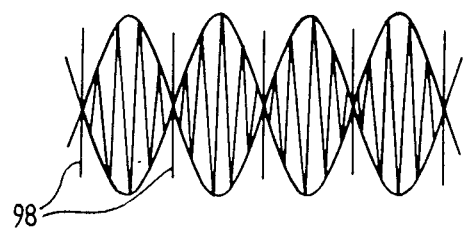

The phase lock loop should have a first order characteristic but spurious time constants that lead to high frequency loop instability necessitates the addition of a loop filter. However, as the loop bandwidth will be finite, the voltage controlled oscillator 32 will be out of lock for a short time and this will produce a transient output from the amplitude demodulator which is sensitive to phase. Unless the effect of the transient outputs can be reduced, they will lead to fast spikes 98 of R.F. at the zero of the envelope as shown in FIG. 10. If the transient outputs cannot be removed by methods such as clamping the amplitude correction error voltage at an appropriate level corresponding to zero R.F. output at the zero crossings, then it will be necessary to minimize the effect of the spikes without introducing phase shifts which may cause the zero to occur at an instant other than the exact time of the phase reversal.

Figure 11:
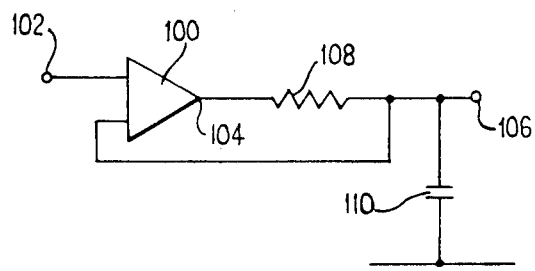
FIG. 11 is a schematic circuit diagram of a rate limited rise time circuit.

One way of reducing this effect of the spikes is to limit the amplitude of the spikes without introducing a phase delay. A further reduction can be achieved without introducing phase delays by using a circuit with a rate limited rise time. An embodiment of such a circuit is shown in FIG. 11. An op-amp 100 has an input terminal 102 for receiving the signal shown in FIG. 10 from the output of the amplitude demodulator, i.e. the mixer 74. The op-amp output 104 is connected to an output terminal 106, via a resistor 108. The output terminal 106 is connected back to another input terminal of the op-amp 100 and is connected to ground by a capacitor 110. In operation the output on the terminal 106 follows the input on the terminal 102 until a predetermined maximum rate of rise is reached which occurs when the output swing at the amplifier output 104 reaches its limit, either positive or negative. As negative spikes are useful for the reasons explained with reference to FIGS. 3 and 4 then, if they are removed together with the positive spikes, means will have to be provided for the rapid recovery of the fast negative spikes.

In the operation of the circuits illustrated in FIGS. 6 and 8 the phase shift changes with input level over a range of about ±15°. These variations in phase shift with varying amplitude may be corrected using variable capacitance diodes in the phase shift circuits and controlling them with the amplitude error control voltage.

In FIG. 6 the setting of the phase shifts of the phase shifters 86 and 88 could be set-up in a number of other ways. One simple alternative way would be to use the opposite slope of the phase sensitive detector and introduce a 180° phase shift. In this case the phase shift provided by the phase shifter 88 would be of the opposite sense and of a greater magnitude.

I claim:

1. In a polar loop transmitter comprising a voltage controlled oscillator, an amplitude modulator connected to receive the output of said voltage controlled oscillator, an output circuit coupled to the amplitude modulator, means coupled to the output circuit for producing an attenuated down-converted signal, a source of radio frequency signals and a feed back circuit connected to the source and down-converting means for producing a control signal for said amplitude modulator;

the improvement wherein said feedback circuit comprises difference circuit means for producing a difference signal whose instantaneous value is the difference between the instantaneous values of said down-converted signal and radio frequency signals, amplitude demodulator means for amplitude demodulating said difference signal, and means applying the thus demodulated signal to said amplitude modulator as a control signal.

2. A polar loop transmitter as claimed in claim 1, further comprising first and second limiters, the first limiter connected to limit the radio frequency signal and the second limiter connected to limit the down converted signal, phase sensitive detecting means having inputs coupled to outputs of the first and second limiters for providing a correction signal for said voltage controlled oscillator.

3. A polar loop transmitter as claimed in claim 2, wherein the output of the first limiter is coupled to said amplitude demodulator means.

4. A polar loop transmitter as claimed in claims 2 or 3, further comprising phase shifting means connected to counter the phase shifts introduced by the first and second limiters.

5. A polar loop transmitter as claimed in claim 4, wherein the phase shifting means comprises a first phase shifter coupling the radio frequency signal to the difference circuit means and a second phase shifter coupling the output of the first limiter to the phase sensitive detecting means.

6. A polar loop transmitter as claimed in claim 1, wherein the difference circuit means comprises a multipier having balanced signal inputs.

7. A polar loop transmitter as claimed in claim 1, further comprising means for reducing transient outputs in the amplitude demodulator means output.

8. A polar loop transmitter as claimed in claim 7, further comprising means for reducing spikes resulting from said transient outputs without introducing a phase delay.

9. A polar loop transmitter as claimed in claim 8, wherein the spike reducing means comprises a circuit having a rate limited rise time.

* * * * *